United States Patent
Ahn

[11] Patent Number: 6,043,502
[45] Date of Patent: Mar. 28, 2000

[54] APPARATUS AND METHOD FOR SENSING AN INSERTION STATE OF A WAFER IN A CASSETTE

[75] Inventor: Byung-seol Ahn, Kyungki-do, Rep. of Korea

[73] Assignee: Samsung Electronics Co., Ltd., Suwon, Rep. of Korea

[21] Appl. No.: 09/188,900

[22] Filed: Nov. 10, 1998

[30] Foreign Application Priority Data

Dec. 30, 1997 [KR] Rep. of Korea ............... 97-79193

[51] Int. Cl.⁷ .................................................. G01N 21/86
[52] U.S. Cl. ........................... 250/559.4; 250/559.37; 356/375
[58] Field of Search ............... 356/375; 250/559.12, 250/599.13, 599.29, 559.3, 559.37, 559.4

[56] References Cited

U.S. PATENT DOCUMENTS

| | | | |
|---|---|---|---|
| 4,786,816 | 11/1988 | Ohmori et al. | 250/559.4 |
| 4,803,373 | 2/1989 | Imamura et al. | 250/559.4 |
| 4,806,773 | 2/1989 | Hiraga et al. | 250/559.4 |
| 5,003,188 | 3/1991 | Igari | 250/559.4 |
| 5,225,691 | 7/1993 | Powers et al. | 250/559.4 |
| 5,239,182 | 8/1993 | Tateyama et al. | 250/559.37 |
| 5,319,216 | 6/1994 | Mokuo et al. | 250/559.4 |
| 5,513,948 | 5/1996 | Bacchi et al. | 414/783 |

Primary Examiner—Frank G. Font
Assistant Examiner—Zandra V. Smith
Attorney, Agent, or Firm—Jones Volentine, LLP

[57] ABSTRACT

An apparatus for sensing an insertion state of a wafer disposed in a slot of a wafer cassette, includes a stage supporting the wafer cassette that is movable relative to a light beam source and photo-detector positioned on either side of the wafer cassette. A position determining mechanism is connected to the photo-detector and a timer is connected to the position determining mechanism. The position determining mechanism receives, from the photo-detector, a position signal indicative of a wafer disposed in the light path. The timer generates a pulse signal that is received by the position determining mechanism after a predetermined time period has elapsed from a time when the position signal is received by the position determining mechanism. The position determining mechanism generates a decision signal, indicative of a wafer incorrectly loaded in a slot of the wafer cassette, when the position signal and pulse signal overlap.

10 Claims, 2 Drawing Sheets

# APPARATUS AND METHOD FOR SENSING AN INSERTION STATE OF A WAFER IN A CASSETTE

BACKGROUND OF THE INVENTION

1. Field of the Invention

The present invention relates generally to an apparatus and method for sensing an insertion state of a wafer in a wafer cassette, and more particularly, to an apparatus and method that optically detects a position of a wafer placed in the cassette and then determines whether or not the wafer is correctly inserted into the cassette slot using a timing device.

2. Description of the Related Art

During semiconductor device fabrication, wafers are generally loaded into cassettes for transfer within and between the various fabrication processes. The cassettes contain a plurality of adjacent slots into which the wafers are inserted. The slots may be oriented vertically, in which case the wafers are inserted horizontally into the cassette, or the slots may be oriented horizontally, in which case the wafers are inserted vertically into the cassette.

During a transfer operation, the wafers inserted into the cassette are carried to a handler of a specific piece of process equipment. A robot extracts each wafer from the cassette and places it in the process equipment, and then returns the wafer to the cassette after the process has been completed.

If the cassette slots are oriented vertically on a cassette stage, the robot loads/unloads the wafers in the cassette by the horizontal operation of a robot arm. Since the robot arm travels along a fixed path, the cassette stage must be vertically driven relative to the robot arm so that successive wafers can be removed by operation of the robot arm.

While the wafers are being inserted into or extracted from the cassette by the robot, optical sensing methods are employed to determine whether a wafer is present in a particular slot. Specifically, a light beam source and a, photo-detector are positioned at opposing sides of the cassette. If the beam passes through the slot and reaches the photo-detector, it is determined that a wafer is not present in the slot. If the beam does not reach the photo-detector, it is assumed that a wafer is blocking the beam and therefore it is determined that a wafer is in the slot. As a result, a wafer position of each slot is determined and the cassette stage is driven vertically to allow the robot to sequentially load/unload the wafers from the corresponding slot positions.

In this conventional method, the wafer position is derived from logic high or low signals that are output by the photo-detector, depending on whether or not the light beam reaches the photo-detector. However, if the wafer is incorrectly positioned in the slot, such as when it is obliquely inserted into the slot, or incompletely inserted into the slot, or if two wafers are inserted into one slot, the existence of the wafer is validated but the correct insertion state of the wafer is not checked or ascertained.

Such incorrectly positioned wafers may be broken by contact between the wafer and the robot arm during the wafer transfer. Also, contact between the robot and the carrier itself may cause the whole carrier to be shifted or vibrated, thereby damaging many of the wafers in the cassette.

Accordingly, a need exists for a system which senses the correct/incorrect insertion state of the wafer within a wafer cassette, and stops the loading/unloading operations if the wafer is incorrectly inserted.

SUMMARY OF THE INVENTION

The present invention is directed to an apparatus and method for sensing a wafer insertion state in a wafer cassette which substantially overcomes one or more of the limitations and disadvantages of the related art.

It is an object of the present invention to provide an apparatus and method for sensing a wafer insertion state in a wafer cassette that optically detects a wafer within a specific slot of a wafer carrier placed on a wafer loading stage that is driven vertically. The actual elapsed period of time in which a wafer is detected is correlated to a normal time period of wafer detection to determine whether or not the wafer is correctly inserted in the slot.

Accordingly, the present invention provides an apparatus and method that detects the insertion state of a wafer disposed in slots of the cassette. The apparatus includes a light beam source and a photo-detector positioned on opposing sides of the cassette. A position determining mechanism determines whether a wafer is incorrectly inserted in the cassette by correlating an output signal of the photo-detector with a delayed timing signal output from a timer. A driving device interlocks the wafer transfer operation when an incorrectly loaded wafer is determined by the position determining mechanism.

The timer generates a pulse signal having a predetermined width after a designated time period has elapsed from the point at which the wafer is detected by the output signal of the photo-detector. If the pulse signal from the timer and the wafer detection signal from the photo-detector overlap, it is determined that the wafer is incorrectly loaded.

Also, the sensing apparatus further includes an alarm device responsive to the result of the position determining mechanism. The alarm may be an audio device or a visual device, such as a light emitting device.

It is to be understood that both the foregoing general description and the following detailed description are exemplary and explanatory and are intended to provide further explanation of the invention as claimed.

BRIEF DESCRIPTION OF THE DRAWINGS

The accompanying drawings illustrate embodiments of the invention, in which.

DETAILED DESCRIPTION OF THE PREFERRED EMBODIMENT

Reference will now be made in detail to the preferred embodiment of the present invention, examples of which are illustrated in the accompanying drawings.

Figure 1:
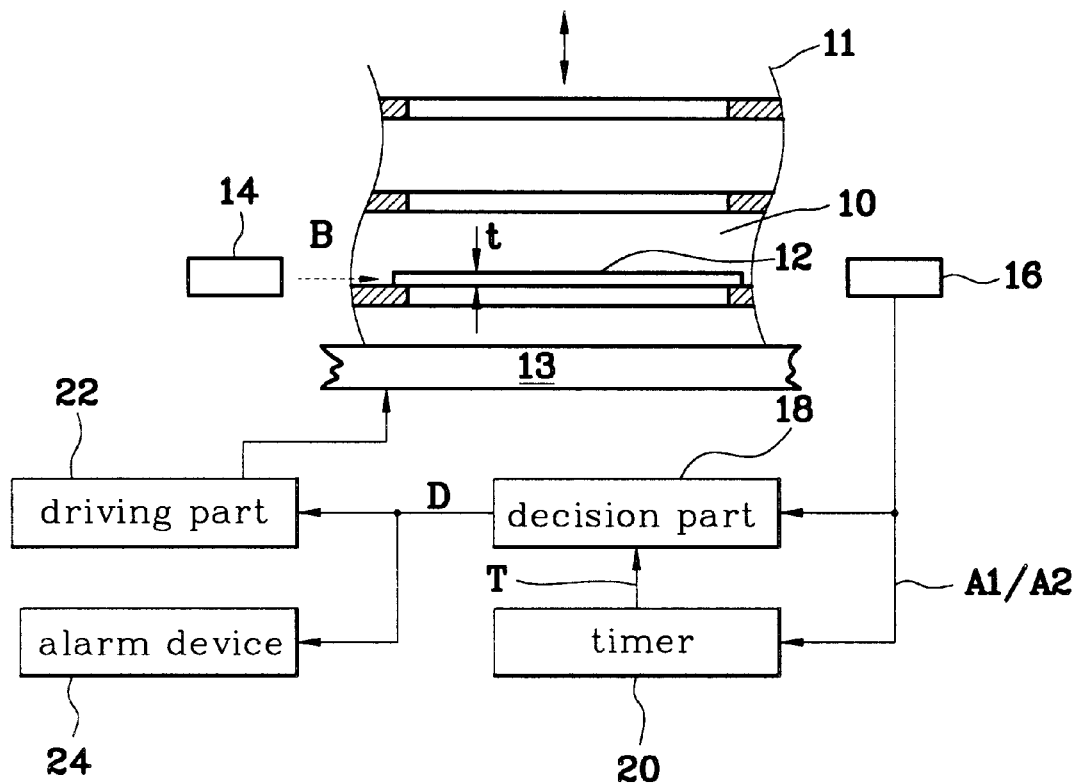
FIG. 1 is a side view of an apparatus for sensing a wafer insertion state in a wafer cassette in accordance with the present invention.

Referring to FIG. 1, the wafer sensing apparatus of the present invention includes a light beam source 14 and a photo-detector 16 disposed on either side of the wafer cassette 11, only a portion of which is shown for simplicity of illustration. The light beam source 14 and the photo-detector 16 are horizontally positioned with regard to the horizontal orientation of the wafers 12 in the vertical wafer cassette 11. They may be positioned either on the left and right, or front and rear sides of the wafer cassette 11, as long as they are horizontally opposed to each other. The light beam source 14, which is connected to a power supply (not shown), outputs a beam B along a light path toward the photo-detector 16.

The insertion state of the wafer 12 is determined by operation of the photo-detector 16, decision part 18 and timer 20 as described below. The photo-detector 16 converts a detected or undetected signal into a voltage signal of a certain discrete level, and transmits the voltage signal to a decision part 18. The decision part 18, or position determining mechanism, is used to determine the position of the wafer 12 relative to the slot 10, so as to ascertain whether the wafer 12 is correctly inserted in the slot 10. A pulse signal T from a timer 20 is applied to one terminal of the decision part 18. The timer 20 outputs the pulse signal T, having a specific width, after a predetermined time has elapsed, with the predetermined time corresponding to the time required to vertically move the beam B along the thickness "t" of the wafer 12.

The decision part 18 correlates the signal state received from the photo-detector 16 with the pulse signal T generated from the timer 20, and outputs a decision signal D to a driving part 22 and an alarm device 24.

The driving part 22 drives a stage 13 on which the wafer cassette 11 is loaded, with the driving part 22 being operative to move the stage 13, and therefore the wafer cassette 11, up and down in the direction of the vertical arrow in FIG. 1. The driving part 22 is also operative to interlock the operation of a wafer transfer robot (not shown) to stop the loading or unloading of the wafers 12 from the cassette 11 in the event an incorrectly loaded wafer is detected.

The alarm device 24 provides either an audible or visual warning that an incorrectly loaded wafer is detected. The audible or visual warning devices may be any suitable conventional means, for example, a horn or light emitting diode.

As described below, during the operation of the present invention, light beam source 14 continuously radiates beam B toward the photo-detector 16 as the stage 13 is vertically driven from slot to slot, so that the vertical extent of each of the slots 10 of the cassette 11 are scanned by the beam B, and the wafer insertion state is determined in accordance with the operation of the photo-detector 16.

Figure 2:
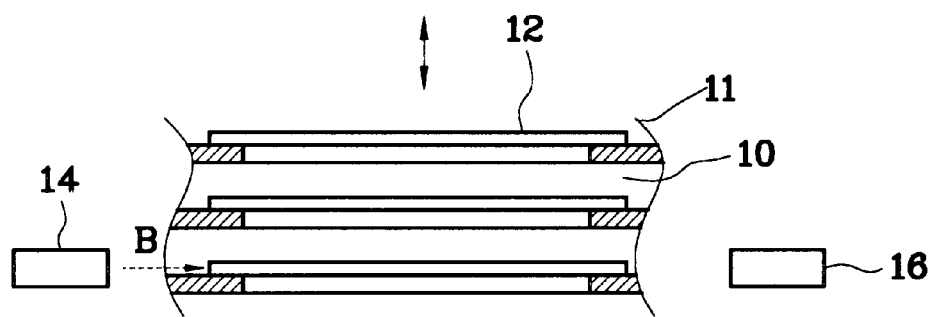
FIG. 2 is a side view of a correct insertion state of a wafer in a cassette in accordance with the present invention.
Figure 3:
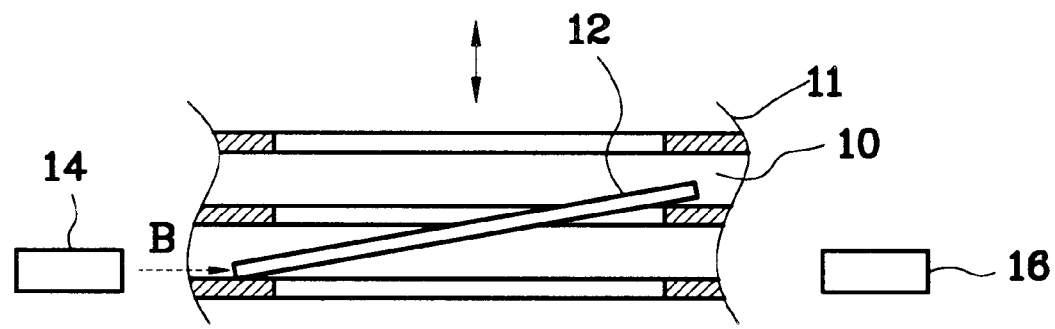
FIG. 3 is a side view of an incorrect insertion state of a wafer in a cassette in accordance with the present invention.

FIG. 2 illustrates a state wherein the wafer 12 is correctly inserted into the slots 10 and FIG. 3 illustrates the state wherein the wafer 12 is incorrectly inserted into the slots 10, such as when the wafer 12 is obliquely disposed between two of the slots 10.

The photo-detector 16 outputs a first pulse signal A1 or a second pulse signal A2 (see FIGS. 1 and 4), depending on the wafer insertion state. More specifically, if there is no wafer 12 in the slot 10, the beam B is continuously received by the photo-detector 16, and the photo-detector 16 generates a low level signal L in a corresponding time period P1. If the wafer 12 exists in the slot 10, the photo-detector 16 generates a high level signal H having a predetermined width as shown in time periods P2, P3 and P4. The width of the high level signal H corresponds to a thickness of the wafer 12 that is detected within the slot 10, since the photo-detector 16 is blocked from receiving the beam B during this period. The remaining low level signal in the time periods P2, P3 and P4 correspond to the state where no wafer 12 is sensed because the photo-detector 16 is again able to detect the beam B from the light beam source 14. Therefore, the first pulse signal A1 is generated when the wafer 12 is correctly positioned in each slot 10 of the cassette 11.

Figure 4:
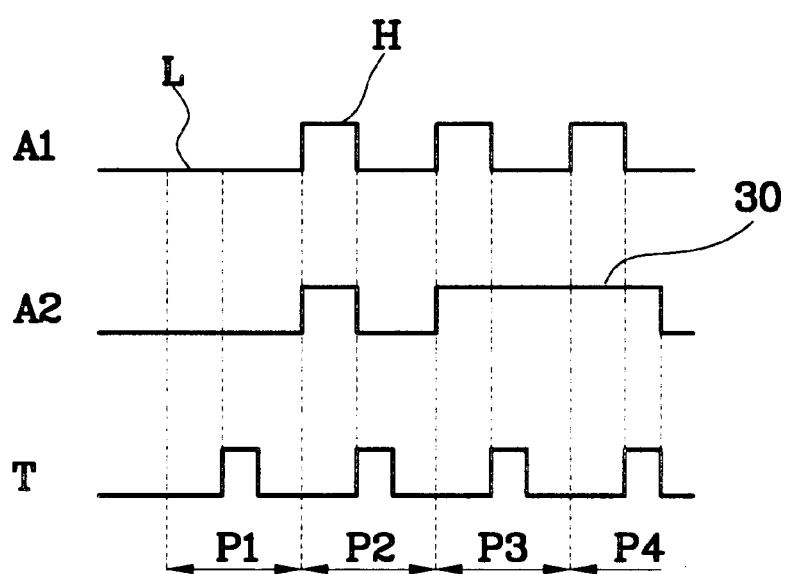
FIG. 4 is a waveform diagram for the decision part of the present invention.

However, as shown in FIG. 3, if the wafer 12 is incorrectly positioned in the slot 10 of the cassette 11, the photo-detector 16 is blocked from receiving the beam B from the light beam source 14, and accordingly, the photo-detector 16 generates a high level signal 30 corresponding to this blocked period, which ranges from time period P3 to time period P4, as shown by the second pulse signal A2 in FIG. 4.

Therefore, depending on the insertion state of the wafer, either the first pulse signal A1 or the second pulse signal A2 are input to the decision part 18. The decision part 18 then determines whether or not the wafer 12 is correctly positioned in the slot 10 based on the pulse signal T generated by the timer 20. The timer 20 counts a period of time corresponding to the amount of time necessary to move the beam B (as driven by the stage 13) along the thickness "t" of the wafer 12 (see FIG. 1), and thereafter outputs the high level pulse signal T having a predetermined width as shown in FIG. 4.

If the photo-detector 16 generates a high level signal (e.g., high level signal 30) during a period wherein the pulse signal T is also at a high level, it is determined that the wafer 12 is incorrectly inserted into the slot 10, that is, either two or more wafers 12 are disposed in the slot 10 or the wafer 12 is obliquely positioned in the slot 10.

If the wafer 12 is incorrectly positioned in the slot 10, the decision part 18 outputs a decision signal D of a high level to the driving part 22 and alarm device 24. The driving part 22 stops the vertical operation of the stage 13 and the transfer robot (not shown). The alarm device then outputs either an audible or visual alarm to alert the operator. After the problem is solved by the operator, the transfer operations are allowed to continue.

One of ordinary skill in the art would understand that the principles of the present invention may be adapted to wafers that are vertically inserted in a horizontal wafer cassette, where the stage supporting the wafer cassette is horizontally movable relative to a light source and photo-detector on opposing sides of the cassette.

Also, while the present invention is described with respect to a movable stage, a fixed light beam source and a fixed photo-detector, in an alternative embodiment the stage itself may be fixed, and the light beam source and photo-detector are movable relative to the stage. What is important is that the stage is in relative movement with the light beam source and photo-detector.

As described above, the present invention accurately senses an incorrectly loaded wafer, thereby preventing damage or destruction of the wafers during the wafer loading/unloading operations. As a result the production yield and equipment reliability is greatly enhanced.

Although preferred embodiments of the present invention have been described in detail hereinabove, many variations and/or modifications of the basic inventive concepts herein taught will appear to those skilled in the art. All such variations and/or modifications fall within the spirit and scope of the present invention as defined in the appended claims.

What is claimed is:

1. An apparatus for sensing an insertion state of a wafer disposed in a slot of a wafer cassette, comprising:

a stage supporting the wafer cassette;

a light beam source positioned on one side of the wafer cassette;

a photo-detector positioned on another side of the wafer cassette in a light path opposing the light beam source for receiving a light beam emanating from the light beam source, the photo-detector generating a position signal of a discrete level as long as it does not receive the beam of light from the light source, and the stage being movable relative to both the light beam source and the photo-detector;

a timer operatively connected to said photo-detector so as to generate a pulse signal only after a predetermined time period has elapsed from a time when the position signal is generated; and a position determining mechanism operatively connected to said photo-detector and to said timer so as to receive said position signal and said pulse signal therefrom, respectively, said position determining mechanism generating a decision signal, indicative of a wafer being incorrectly loaded in the slot of the wafer cassette, when the pulse signal and the position signal are received simultaneously.

2. An apparatus according to claim 1, further comprising:

a driving device connected to the position determining mechanism and the stage; and an alarm device connected to the position determining mechanism.

3. An apparatus according to claim 2, wherein the predetermined time period is a time required for moving the stage relative to the light beam source a distance equal to a known thickness of the wafer.

4. An apparatus according to claim 2, wherein the driving device stops movement of the stage in response to the decision signal, and wherein an alarm is generated by the alarm device in response to the decision signal.

5. An apparatus according to claim 4, wherein the alarm is an audio alarm.

6. An apparatus according to claim 4, wherein the alarm is a visual alarm.

7. A method for sensing an insertion state of a wafer disposed in a slot of a wafer cassette, comprising:

providing a wafer cassette on a stage, wherein the stage is movable relative to a light beam source and a photo-detector positioned on opposing sides of the wafer cassette;

radiating a light beam along a light path from the light beam source toward the photo-detector;

moving the stage and the light beam source relative to one another while the light beam is radiating from the light beam source toward the pho detector;

generating a position signal of a discrete level as long as the beam of light from the light beam source does not reach the photo-detector to thereby indicate the presence of a wafer in the light path;

generating a pulse signal only after a predetermined time period has elapsed form a time when the position signal is generated; and judging that a wafer is incorrectly loaded in the slot of the wafer cassette when it is determined that the pulse signal and the position signal overlap.

8. A method according to claim 7, wherein the predetermined time period is a time required for moving the stage relative to the light beam source a distance equal to a known thickness of the wafer.

9. A method according to claim 8, wherein said step of judging comprises generating a decision signal, indicative of a wafer incorrectly loaded in the slot of the wafer cassette, when the position signal and pulse signal are generated simultaneously.

10. A method according to claim 9, further comprising:

stopping movement of the stage in response to the decision signal, and generating an alarm in response to the decision signal.

* * * * *